United States Patent
Chang et al.

(10) Patent No.: US 10,727,399 B2
(45) Date of Patent: *Jul. 28, 2020

(54) TOP ELECTRODE CAP STRUCTURE FOR EMBEDDED MEMORY

(71) Applicant: Taiwan Semiconductor Manufacturing Co., Ltd., Hsin-Chu (TW)

(72) Inventors: Yao-Wen Chang, Taipei (TW); Tsung-Hsueh Yang, Taichung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/601,956

(22) Filed: Oct. 15, 2019

(65) Prior Publication Data

US 2020/0044143 A1    Feb. 6, 2020

Related U.S. Application Data

(60) Continuation of application No. 16/385,271, filed on Apr. 16, 2019, now Pat. No. 10,505,103, which is a division of application No. 15/687,976, filed on Aug. 28, 2017, now Pat. No. 10,276,779.

(51) Int. Cl.
*H01L 43/02* (2006.01)
*H01L 43/08* (2006.01)
*H01L 43/12* (2006.01)

(52) U.S. Cl.
CPC .............. *H01L 43/02* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 9,172,036 B2 | 10/2015 | Chen et al. | |
| 9,431,609 B2 | 8/2016 | Dang et al. | |
| 10,276,779 B2 * | 4/2019 | Chang | H01L 43/02 |
| 2009/0039332 A1 | 2/2009 | Lee et al. | |

(Continued)

OTHER PUBLICATIONS

Non-Final Office Action dated Oct. 4, 2018 for U.S. Appl. No. 15/687,976.

(Continued)

*Primary Examiner* — Lex H Malsawma
(74) *Attorney, Agent, or Firm* — Eschweiler & Potashnik, LLC

(57) ABSTRACT

The present application relates to a method for forming a top-electrode cap structure on a memory cell. In some embodiments, a method for forming a top-electrode cap structure on a memory cell. The method includes providing a memory cell comprising a top electrode, a bottom electrode, and a resistive memory element sandwiched between the top and bottom electrodes. An etch is performed into an interlayer dielectric (ILD) layer covering the memory cell to form a via opening exposing the top electrode of the memory cell. A getter layer is then formed to line the via opening, and further, over and abutting the top electrode of the memory cell. An oxygen-resistant layer is formed over and abutting the getter layer.

20 Claims, 12 Drawing Sheets

(56) References Cited

U.S. PATENT DOCUMENTS

| | | |
|---|---|---|
| 2009/0072216 A1 | 3/2009 | Lung et al. |
| 2010/0219491 A1 | 9/2010 | Lee et al. |
| 2011/0227026 A1 | 9/2011 | Sekar et al. |
| 2013/0214234 A1 | 8/2013 | Gopalan et al. |
| 2014/0077147 A1 | 3/2014 | Tong et al. |
| 2014/0175354 A1 | 6/2014 | Wang et al. |
| 2019/0043795 A1 | 2/2019 | Chen et al. |
| 2019/0245138 A1* | 8/2019 | Chang .................. H01L 43/02 |

OTHER PUBLICATIONS

Notice of Allowance dated Jan. 17, 2019 for U.S. Appl. No. 15/687,976.

Non-Final Office Action dated May 16, 2019 for U.S. Appl. No. 16/385,271.

Notice of Allowance dated Aug. 15, 2019 for U.S. Appl. No. 16/385,271.

\* cited by examiner

TOP ELECTRODE CAP STRUCTURE FOR EMBEDDED MEMORY

REFERENCE TO RELATED APPLICATIONS

This Application is a Continuation of U.S. application Ser. No. 16/385,271, filed on Apr. 16, 2019, which is a Divisional of U.S. application Ser. No. 15/687,976, filed on Aug. 28, 2017 (now U.S. Pat. No. 10,276,779, issued on Apr. 30, 2019). The contents of the above-referenced Patent Applications are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its data memory contents when power is lost. Magnetoresistive random-access memory (MRAM) is one promising candidate for next generation non-volatile memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
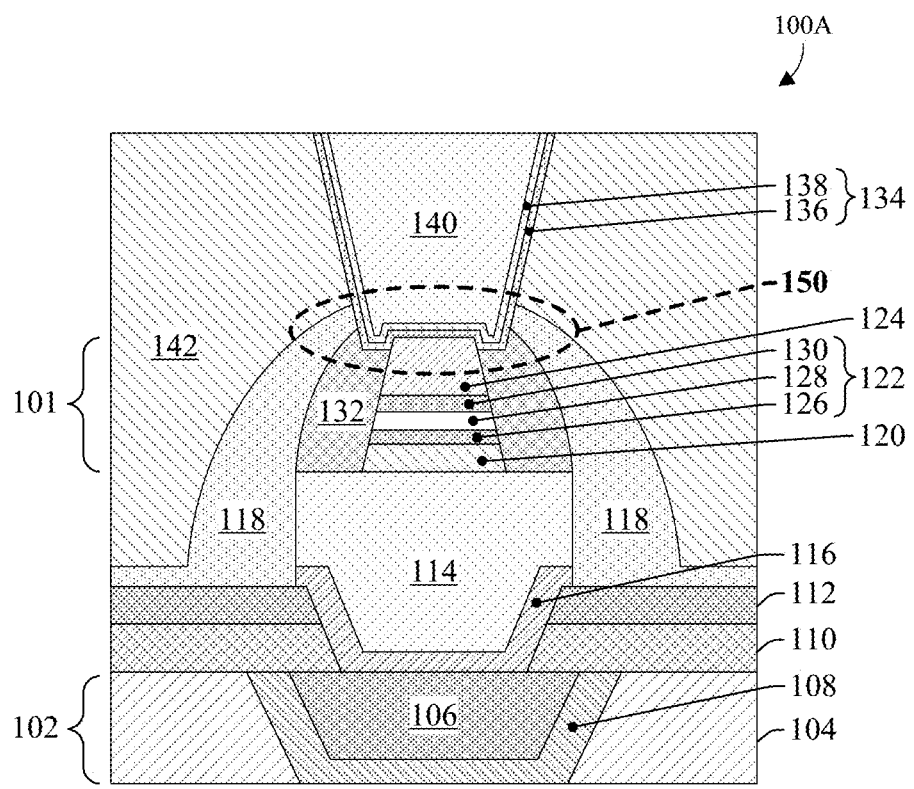
FIG. 1A illustrates a cross-sectional view of some embodiments of an integrated circuit comprising a memory cell with an enhanced top electrode cap structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different types of devices on a single substrate. For example, a logic region and a memory region may be formed on a single substrate. In some embodiments, the memory region may comprise a magnetic random access memory (MRAM) cell or a resistive random access memory (RRAM) cell. MRAM and RRAM cells comprise resistive memory elements that are vertically arranged within a back-end-of-the-line (BEOL) metallization stack, between a bottom electrode and a top electrode.

For example, the resistive memory element of a MRAM cell may be a magnetic tunnel junction (MTJ). The MTJ includes ferromagnetic films separated by an insulating film. The magnetization direction of at least one of the ferromagnetic films can be switched by an external magnetic field. If the magnetization directions of the ferromagnetic films are in a parallel orientation, it is more likely that electrons will tunnel through the insulating film than if they are in the antiparallel orientation. Consequently, the MTJ can be switched between two states of electrical resistance, one with low resistance and one with high resistance, to store data.

The layers of the resistive memory elements are thin. For example, electrons can tunnel from one ferromagnetic film into the other ferromagnetic film because the insulating layer is thin (typically a few nanometers). Since the layers of the resistive memory elements are thin, oxidation, even a small amount, can have a deleterious effect. Likewise, the electrodes separated from each other by the resistive memory elements can suffer from oxidation. For example, when an opening for a top electrode via (TEVA) is formed, the top electrode is exposed to the environment, which may contain oxygen gas causing the top electrode to suffer oxidation. Even if a pre-clean is performed and the top electrode is covered by a capping layer with low oxidation potential, the pre-clean may not remove all oxidation and/or some oxygen may bypass the capping layer and re-oxidize the top electrode. As a result of the oxidation on the top electrode, contact resistance increases, which leads to a poor read window and low yield.

Accordingly, various embodiments of the present disclosure are directed towards an integrated circuit comprising a memory cell with an enhanced top electrode cap structure to prevent oxidation on the top electrode. In some embodiments, the memory cell comprises a memory element, a top electrode on the memory element, and a cap structure covering and protecting the top electrode. The cap structure includes a getter layer that has a high concentration of a metal (e.g., titanium) that is highly absorptive of oxygen. The getter layer traps errant oxygen to reduce the risk of the top electrode oxidizing. Further, the cap structure includes an oxygen-resistant layer that overlies the getter layer and that has a high resistance to oxidation. Accordingly, the cap structure reduces the susceptibility of the top electrode to oxidation, and thus protects operation of the memory cell.

FIG. 1A illustrates a cross-sectional view 100A of some embodiments of an integrated circuit (IC) comprising a memory cell 101 with an enhanced top electrode cap structure 134. The memory cell 101 is arranged over a substrate 102. In some embodiments, the substrate 102 comprises a lower portion of a BEOL metallization stack (partially shown) and a semiconductor substrate (not shown) underlying the BEOL metallization stack. The lower portion of the BEOL metallization stack comprises a lower inter-layer dielectric (ILD) layer 104 and a lower metal layer 106 sunken into the lower ILD layer 104. The lower metal layer 106 is conductive and may be, for example, copper, aluminum copper, some other metal, or a combination therefore. In some embodiments, the lower metal layer 106 is partially surrounded by a first diffusion barrier layer 108. The first diffusion barrier layer 108 is in direct contact with the lower metal layer 106 and conforms to the shape of the lower metal layer 106. The first diffusion barrier layer 108 may be, for example, titanium nitride, tantalum nitride, or some other barrier material. The lower ILD layer 104 may be, for example, oxide, a low κ dielectric, some other dielectric material, or a combination of the foregoing. As used herein, a low κ dielectric is a dielectric with a dielectric constant κ less than about 3.9, 3, 2, or 1.

A first dielectric protection layer 110 is arranged over the lower ILD layer 104. In some embodiments, the first dielectric protection layer 110 comprises silicon carbide, silicon nitride, some other dielectric, or combinations thereof. A second dielectric protection layer 112 overlies the first dielectric protection layer 110. In some embodiments, the second dielectric protection layer 112 comprises silicon rich oxide (SRO), some other oxide, some other dielectric, or combinations thereof.

A bottom electrode via (BEVA) 114 and a second diffusion barrier layer 116 are arranged in the first dielectric protection layer 110 and second dielectric protection layer 112. The second diffusion barrier layer 116 is conformally disposed around at least a portion of the BEVA 114 and overlies the lower metal layer 106, between the lower metal layer 106 and the BEVA 114. In some embodiments, the second diffusion barrier layer 116 is in direct contact with the BEVA 114 and/or the lower metal layer 106. Further, in some embodiments, the second diffusion barrier layer 116 may extend upward from the lower metal layer 106 to the BEVA 114. The second diffusion barrier layer 116 may comprise tantalum nitride, silicon carbide, silicon nitride, or combinations thereof. A protective layer 118 is positioned on opposite sides of the BEVA 114 and the second diffusion barrier layer 116. In some embodiments, the protective layer 118 laterally encloses (e.g., completely laterally surrounds) the BEVA 114 and the second diffusion barrier layer 116. Accordingly, the protective layer 118 may be an outer sidewall spacer structure. A lowermost surface of the protective layer 118 contacts the second dielectric protection layer 112. The protective layer 118 extends upward from the second dielectric protection layer 112 and has arched inner and outer sidewalls. The protective layer 118 may comprise silicon carbide, silicon nitride, or combinations thereof.

The memory cell 101 is arranged on the BEVA 114. The memory cell 101 includes a bottom electrode 120, a memory element 122, and a top electrode 124. In some embodiments, the memory element 122 may be a resistive switching layer. In some embodiments, the memory element 122 is a MTJ and includes: a lower ferromagnetic layer 126, a MTJ insulating layer, and an upper ferromagnetic layer 130. Further, in some embodiments, the upper or lower ferromagnetic layer 126, 130 is pinned or fixed to a magnetization direction. In other embodiments, the memory element 122 is an RRAM memory element.

The bottom electrode 120 and the top electrode 124 may be comprised of conductive materials, such as, for example, titanium nitride (TiN), tantalum nitride (TaN), tantalum (Ta), titanium (Ti), or combinations thereof. In some embodiments, during manufacture of the IC, the top electrode 124 is cleaned to remove a top layer of absorbed atoms (e.g., oxygen atoms). The cleaning may, for example, physically remove the absorbed atoms by striking an upper surface of the top electrode 124 with inert atoms to knock any absorbed atoms off the top electrode 124. Accordingly, the upper surface may be uneven and/or devoid of oxidation.

The bottom electrode layer 120, the memory element 122, and the top electrode 124 are surrounded by a dielectric spacer 132. The dielectric spacer 132 is on opposite sides of each of the bottom electrode layer 120, the memory element 122, and the top electrode 124. Further, in some embodiments, the dielectric spacer 132 laterally encloses (e.g., completely laterally surrounds) each of the bottom electrode layer 120, the memory element 122, and the top electrode 124. The dielectric spacer 132 may have inner sidewalls that contact the bottom electrode layer 120, the memory element 122, and the top electrode 124. Further, the dielectric spacer 132 may have outer sidewalls that are arched and/or that conformally abut the arched inner sidewalls of the protective layer 118. The dielectric spacer 132 may be, for example, silicon nitride, silicon dioxide, some other dielectric, or a combination of the foregoing.

The cap structure 134 is positioned over the top electrode 124. The cap structure 134 includes a getter layer 136 and an oxygen-resistant layer 138. The getter layer 136 is over the top electrode 124. In some embodiments, the getter layer 136 is over and contacts a top surface of the top electrode 124. Further, in some embodiments, the getter layer 136 extends below the top surface of the top electrode 124 and conforms to sidewalls of the top electrode 124. Alternatively, in other embodiments, the getter layer 136 is inlaid in regions of the top electrode 124, for example, the getter layer 136 may be formed in at least one trench (not shown) in the top electrode 124.

The getter layer 136 comprises a getter material configured to absorb gasses that may negatively affect (e.g., oxidize) the top electrode 124. The gases include, for example, hydrogen gas, oxygen gas, water vapor, or nitrogen gas. The getter material is or otherwise includes, for example, titanium (Ti), zirconium, hafnium, lanthanum, palladium, palladium silver, palladium ruthenium, or a combination of the foregoing. In some embodiments, about 50% or more of a mass of the getter layer 136 is made up of the getter material. Further, in some embodiments, the getter layer 136 comprises absorbed atoms. For example, the getter layer 136 may comprise oxygen absorbed from the top electrode 124, such that the getter layer 136 may, for example, be or otherwise comprise a metal oxide (e.g., titanium oxide). The getter rich characteristic of the getter layer 136 may, for example, cause the getter layer 136 to be highly reactive to oxygen, such that the getter layer 136 may be highly efficient at absorbing errant oxygen particles. In some embodiments, the getter layer 136 is a first material having a higher reactivity with oxygen (e.g., requires less energy to react with oxygen) than a second material of the top electrode 124. For example, the top electrode 124 may be tantalum, whereas the getter layer 136 may be hafnium, titanium, zirconium, or lanthanum. Further, in some embodiments, the getter layer 136 is a first material having a higher affinity for the gases (e.g., hydrogen and/or oxygen gas) than a second material of the top electrode 124. Further yet, in some embodiments, the getter layer 136 is non-crystalline and/or non-porous, such that the getter layer 136 may be less brittle (i.e., has higher mechanical strength) and/or more readily formed into films.

An oxygen-resistant layer 138 overlies the getter layer 136. The oxygen-resistant layer 138 may contact and be conformal with the getter layer 136. The oxygen-resistant layer 138 may be or otherwise include a metal or ceramic with a lower reactivity with oxygen (e.g., requires more energy to react with oxygen) than the getter layer 136 and/or the top electrode 124. The metal or ceramic is or otherwise includes, for example, titanium nitride, tantalum nitride, nickel, tungsten, copper, gold, ruthenium, platinum, or a combination of the foregoing. In some embodiments, the titanium nitride has a ratio or nitrogen to titanium (N/Ti) by mass that is about 0.9-1.1 (e.g., 1.02). Further, in some embodiments, the oxygen-resistant layer 138 is titanium nitride (e.g., with ratio of N/Ti of about 1.02), the getter layer 136 is titanium (e.g., pure or elemental titanium), and the top electrode 124 is tantalum (e.g., pure or elemental tantalum). The oxygen-resistant layer 138 protects the getter layer 136 from being exposed to more oxygen than it can absorb.

The dual layers of the cap structure 134, the getter layer 136 and the oxygen-resistant layer 138, cooperatively protect the top electrode 124. The oxygen-resistant layer 138 protects underlying layers from being exposed to oxygen and, should oxygen get past the oxygen-resistant layer 138, the getter layer 136 absorbs the unwanted oxygen. Additionally, if any oxygen remains on the top electrode 124 after cleaning, the getter layer 136 may absorb the remaining oxygen. Thus, the cap structure 134 reduces oxidation of the top electrode 124, which can negatively affect operation of the memory cell 101. For example, oxidation can increase contact resistance, which leads to a poor read window and low yield.

A top electrode via (TEVA) 140 extends from the top electrode 124, through the cap structure 134 and an upper ILD layer 142. In some embodiments, the TEVA 140 contacts the cap structure 134. The TEVA 140 may be, for example, a metal, such as copper, aluminum, tungsten, or combinations thereof. The upper ILD layer 142 may comprise tetraethyl orthosilicate (TEOS), some other oxide, a low κ dielectric, some other dielectric material, or a combination of the foregoing.

Figure 1B:
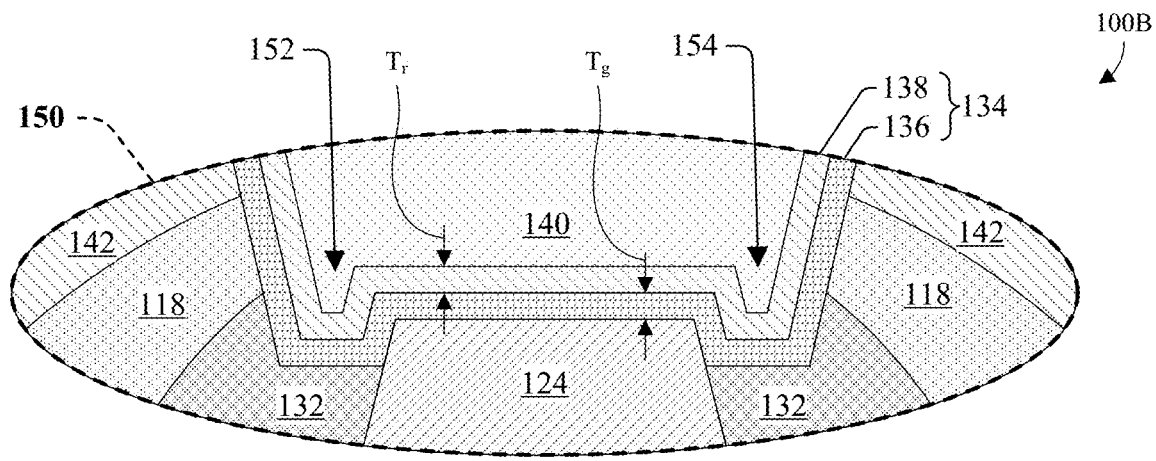
FIG. 1B illustrates an enlarged cross-sectional view of some embodiments of the enhanced top electrode cap structure of FIG. 1A.

FIG. 1B illustrates an enlarged cross-sectional view 100B of some embodiments of the enhanced top electrode cap structure 134 of FIG. 1A. The enlarged cross-sectional view 100B may, for example, be taken within oval 150 in FIG. 1A. As illustrated, in some embodiments, the getter layer 136 extends below an upper surface of top electrode 124 and/or conforms to sidewalls of the top electrode 124. As such, in some embodiments, the cap structure 134 defines a first trench 152 and a second trench 154 (in a cross-section view) separated by the top electrode 124. In some embodiments, the first trench 152 and the second trench 154 are parts of an annular trench as viewed in cross-section.

Further, in some embodiments an upper surface of the oxygen-resistant layer 138 in the first trench 152 and the second trench 154 is positioned at point lower than the upper surface of the top electrode 124. The getter layer 136 has a thickness, $T_g$, that may be, for example, between about 50-100 angstroms, between about 25-75 angstroms, between about 10-50 angstroms, or less than about 100 angstroms. The oxygen-resistant layer 138 has a thickness, $T_r$, that may be, for example, between about 50-150 angstroms, between about 75-125 angstroms, between about 10-200 angstroms, or less than about 200 angstroms. In some embodiments, the thickness, $T_g$, of the getter layer 136 is about 50 angstroms, and the thickness, $T_r$, of the oxygen-resistant layer 138 is about 100 angstroms. The thickness, $T_r$, of the oxygen-resistant layer 138 may be greater than the thickness, $T_g$, of the getter layer 136.

Figure 2:
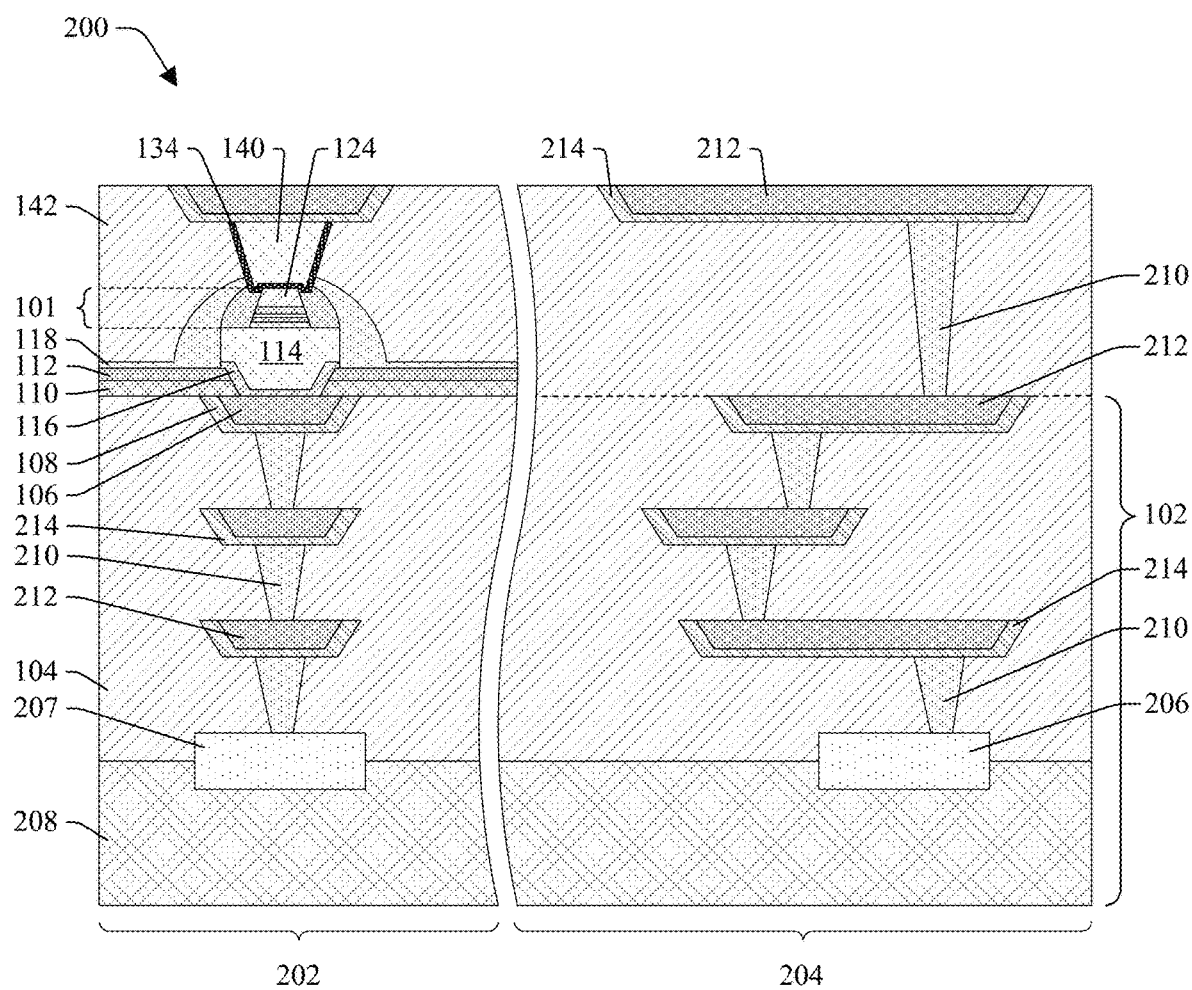
FIG. 2 illustrates an expanded cross-sectional view of some embodiments of the integrated circuit of FIG. 1A.

FIG. 2 illustrates an expanded cross-sectional view 200 of some embodiments of the integrated circuit of FIG. 1A. As illustrated, the integrated circuit is divided into a memory region 202 and a logic region 204. The memory region 202 accommodates a memory cell array (partially shown), including the memory cell 101 of FIG. 1A. Each memory cell of the memory cell array may, for example, be as the memory cell 101 of FIG. 1A is shown and described with respect to FIG. 1A. The logic region 204 accommodates a plurality of logic devices 206 (only one of which is shown). The logic devices 206 may, for example, facilitate reading and writing of data to the memory cell 101. Further, the logic devices 206 may be or otherwise include, for example, insulated field-effect transistors (IGFETs), a metal-oxide-semiconductor field-effect transistors (MOSFETs), or some other type of semiconductor device.

The integrated circuit comprises a semiconductor substrate 208 and a plurality of ILD layers stacked on the semiconductor substrate 208. The semiconductor substrate 208 may be, for example, a bulk silicon substrate, a silicon-on-insulator (SOI) substrate, or some other type of semiconductor substrate. The ILD layers comprise a lower ILD layer 104 covering the semiconductor substrate 208, and further comprise an upper ILD layer 142 covering the lower ILD layer 104. The logic devices 206 are recessed into a top surface of the semiconductor substrate 208, between the semiconductor substrate 208 and the lower ILD layer 104. In some embodiments, an access device 207 underlies each memory cell of the memory cell array, between the semiconductor substrate 208 and the lower ILD layer 104. The access device 207 may be, for example, an IGFET, a MOSFET, or some other type of transistor. Further, the memory cell array is spaced over the semiconductor substrate 208, between the lower and upper ILD layers 104, 142. The lower and upper ILD layers 104, 142 may be, for example, oxide, nitride, a low κ dielectric, some other dielectric, or a combination of the foregoing.

Conductive features are stacked in the ILD layers to define conductive paths interconnecting the logic devices 206 and the memory cell array. The conductive features include vias 210 and wires 212. The wires 212 include a lower metal layer 106, and the vias 210 include a TEVA 140 and a BEVA 114. For ease of illustration, only some of the vias 210 are labeled 210 and only some of the wires 212 are labeled 212. The vias 210 and the wires 212 may be, for example, tungsten, copper, aluminum copper, aluminum, some other conductive material, or a combination of the foregoing. In some embodiments, the wires 212 are lined by diffusion barrier layers 214, including the diffusion barrier layer 108 of the lower metal layer 106. For ease of illustration, only some of the diffusion barrier layers 214 are labeled 214. The diffusion barrier layers 214 may be, for example, titanium nitride, tantalum nitride, some other barrier material, or a combination of the foregoing.

Figure 3A:
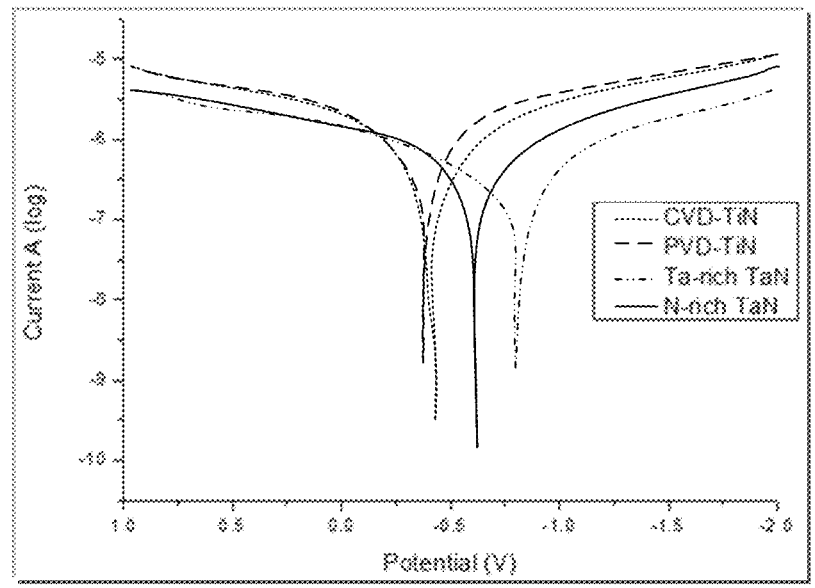
FIG. 3A illustrates a graph showing getter material oxidation resistance associated with a deionized water solution.

FIG. 3A illustrates a graph 300A showing the oxidation resistance of the oxygen-resistant layer 138 material associated with a deionized water solution used to clean the top electrode 124. The ability of the enhanced top electrode cap structure 134 to resist oxidation may be based on the cleaning type of the top electrode 124 combined with the oxygen resistant nature of the enhanced top electrode cap structure 134. Here, TiN for the oxygen-resistant layer 138 has an improved oxidation as compared to TaN.

Figure 3B:
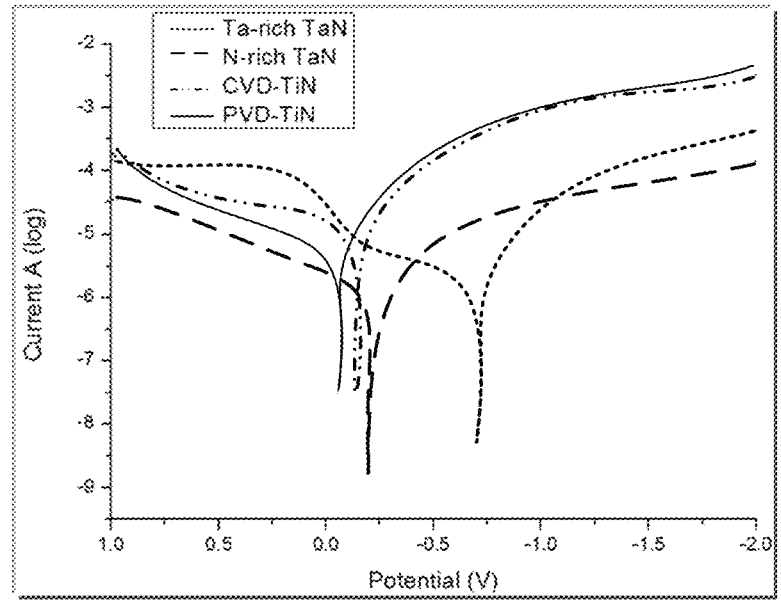
FIG. 3B illustrates a graph showing getter material oxidation resistance associated with a slurry solution.

FIG. 3B illustrates a graph 300B showing the oxygen-resistant layer 138 material oxidation resistance associated with a slurry solution used during a chemical mechanical planarization (CMP) process to form the top electrode 124. TiN has an improved oxidation resistance as compared to TaN when used in a slurry. Accordingly, the oxidation resistance is considered for the materials of the cap structure 134 at multiple points during processing such as the CMP and cleaning of the top electrode 124.

FIGS. 4-19 illustrate a series of cross-sectional views 400-1900 of some embodiments of a method of forming a memory cell with an enhanced cap structure. The memory cell may, for example, correspond to the memory cell of FIGS. 1A and 1B.

Figure 4:
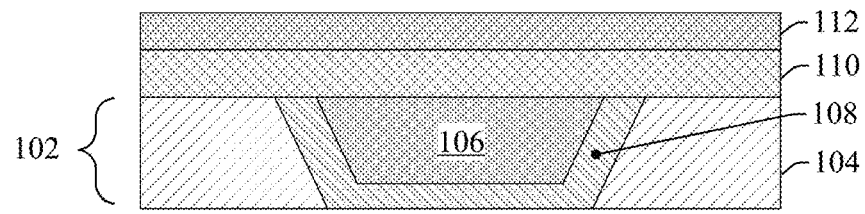
FIGS. 4-19 illustrate a series of cross-sectional views of some embodiments of a method of forming a memory cell with an enhanced top electrode cap structure.

As shown in cross-sectional view 400 of FIG. 4, a substrate 102 is provided or otherwise formed. The substrate 102 comprises a lower ILD layer 104 and a lower metal layer 106. The lower ILD layer 104 may be an oxide, a low-k dielectric, an ultra low-k dielectric, some other dielectric, or a combination of the foregoing. The lower metal layer 106 and a first diffusion barrier layer 108 are recessed into a top of in the lower ILD layer 104, and the first diffusion barrier layer 108 lines an underside of the lower metal layer 106. In some embodiments, the lower metal layer 106 and the first diffusion barrier layer 108 are formed by performing an etch into the lower ILD layer 104 to form an opening in the lower ILD layer 104. The first diffusion barrier layer 108 may be formed lining the opening, and a conductive layer (e.g., copper, aluminum, etc.) may be formed filling the opening over the first diffusion barrier layer 108. Further, a planarization process may be performed into the first diffusion barrier layer 108 and the conductive layer to remove material outside the opening.

A first dielectric protection layer 110 is formed over the lower ILD layer 104 and an upper surface of the lower metal layer 106. The first dielectric protection layer 110 may comprise of silicon-nitride (SiN), silicon-carbide (SiC), some other dielectric, or combinations thereof. In some embodiments, the first dielectric protection layer 110 may be approximately 30 nanometers thick. A second dielectric protection layer 112 is formed over the first dielectric protection layer 110. The second dielectric protection layer 112 may comprise silicon rich oxide (SRO), tetraethyl orthosilicate (TEOS), some other dielectric, or combinations thereof. The first dielectric protection layer 110 and the second dielectric protection layer 112 may be formed by one or more deposition processes, such as, for example, physical vapor deposition, chemical vapor deposition, sputtering, or some other deposition process.

Figure 5:
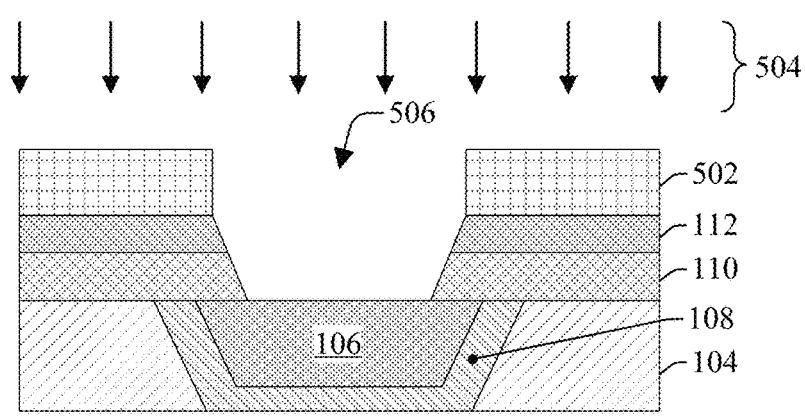

As shown in cross-sectional view 500 of FIG. 5, a mask layer 502 is formed and patterned over the second dielectric protection layer 112. An etching process 504 is performed through an etch opening 506 in the mask layer 502 to pattern the second dielectric protection layer 112 and the underlying first dielectric protection layer 110. In some embodiments, the mask layer 502 can be a photoresist layer. In some embodiments, the etch opening 506 allows a dry etch process, such as a plasma etching, to reach the second dielectric protection layer 112 and the underlying first dielectric protection layer 110.

Figure 6:
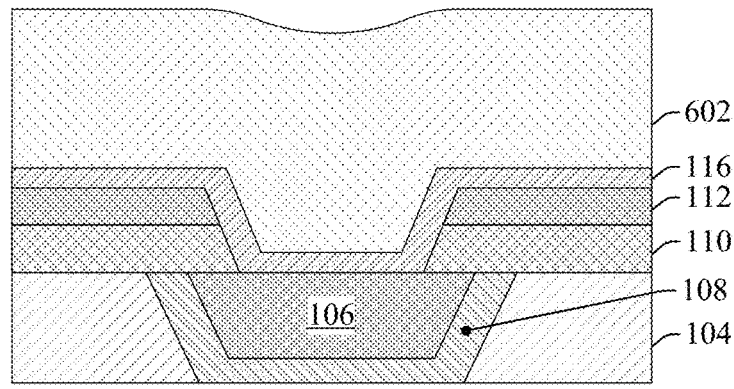

As shown in cross-sectional view 600 of FIG. 6, a bottom electrode via (BEVA) layer 602 and a second diffusion barrier layer 116 are formed over the second dielectric protection layer 112. In particular, the etch opening 506 may be lined with a diffusion barrier layer material to form the second diffusion barrier layer 116 and then filled with the BEVA layer 602. The diffusion barrier layer material may be or otherwise include, for example, titanium nitride, tantalum nitride, some other barrier material, or a combination of the foregoing. The BEVA layer 602 is a conductive material (e.g., copper, aluminum, etc.).

Figure 7:
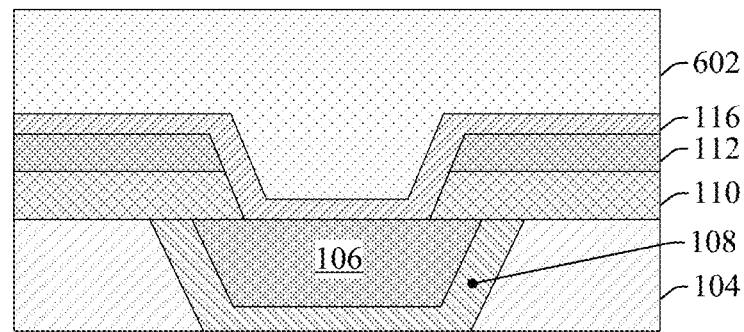

As shown in cross-sectional view 700 of FIG. 7, a planarization process is performed to remove flatten an upper surface of the BEVA layer 602. In some embodiments, the planarization process may be a chemical mechanical planarization (CMP).

Figure 8:
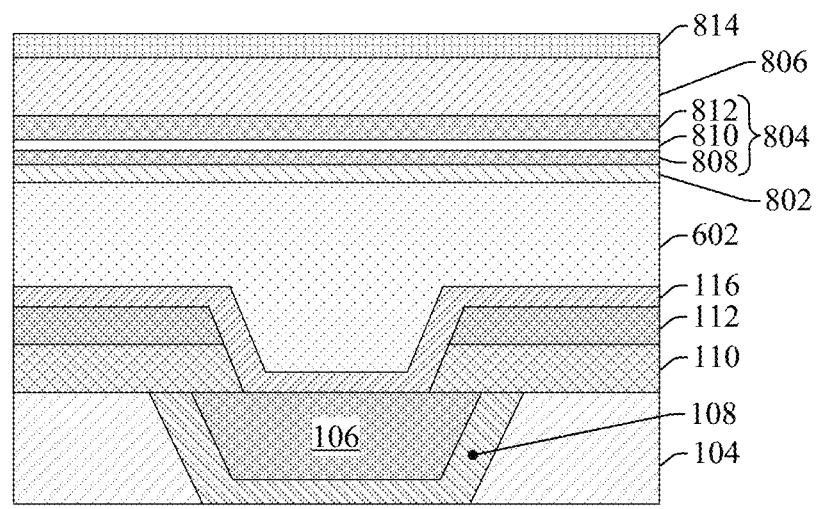

As shown in cross-sectional view 800 of FIG. 8, a bottom electrode layer 802, a memory element film 804, a top electrode layer 806, and a hardmask layer 814 are deposited. In some embodiments, the memory element film 804 may comprise a magnetic tunnel junction (MTJ) film having a pinned ferromagnetic layer 808 and a free ferromagnetic layer 812, which are vertically separated by a dielectric barrier layer 810. In still other embodiments, the memory element film 804 may comprise a RRAM dielectric data storage film. In some embodiments, the memory element film 804 is approximately 3 nanometers thick.

The bottom electrode layer 802 and the top electrode layer 806 are comprised of one or more conductive layers. In some embodiments, the top electrode layer 806 may be comprised of titanium nitride (TiN), tantalum nitride (TaN), a metal (e.g., titanium (Ti) or tantalum (Ta)), or some other conductive material. In some embodiments, the top electrode layer 806 is approximately 100 nanometers thick. The hardmask layer 814 overlies the top electrode layer 806. The bottom electrode layer 802, the memory element film 804, the top electrode layer 806, and the hardmask layer 814 may be formed by one or more deposition processes (e.g., physical vapor deposition, chemical vapor deposition, etc.).

Figure 9:
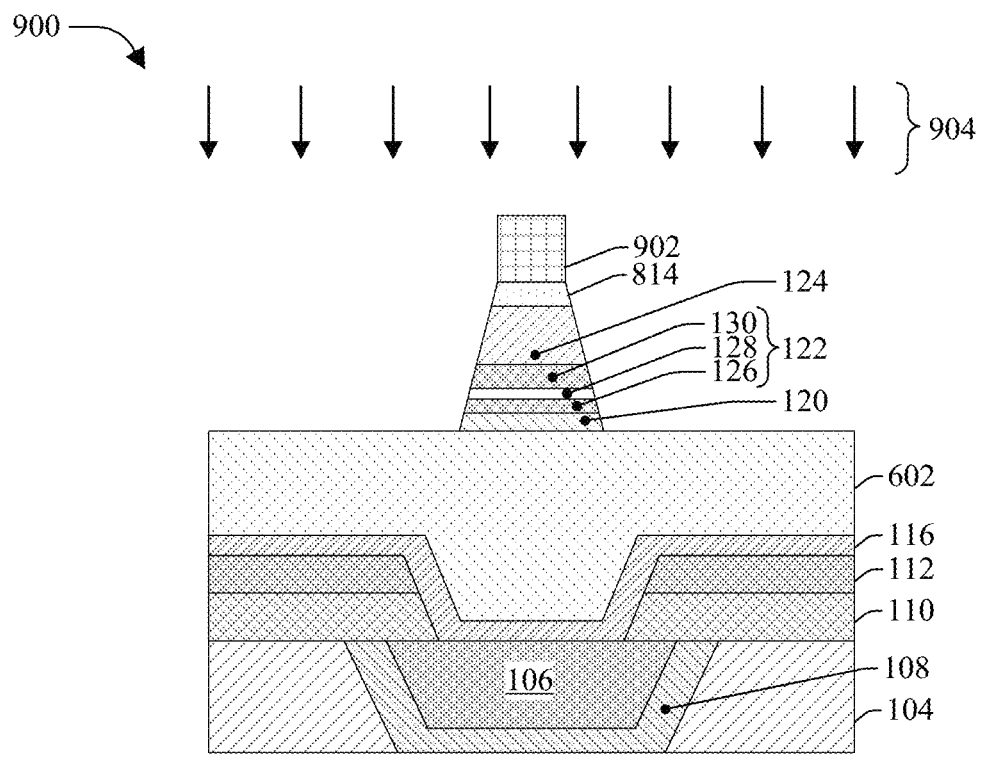

As shown in cross-sectional view 900 of FIG. 9, a photoresist 902 is deposited over a portion of the hardmask layer 814. Subsequently, an etching process 904 patterns the bottom electrode layer 802, the memory element film 804, and the top electrode layer 806 to form a bottom electrode 120, a memory element 122, and a top electrode 124, respectively. The etching process 904 may be a dry etch process, such as plasma etching, to reach the BEVA layer 602.

Figure 10:
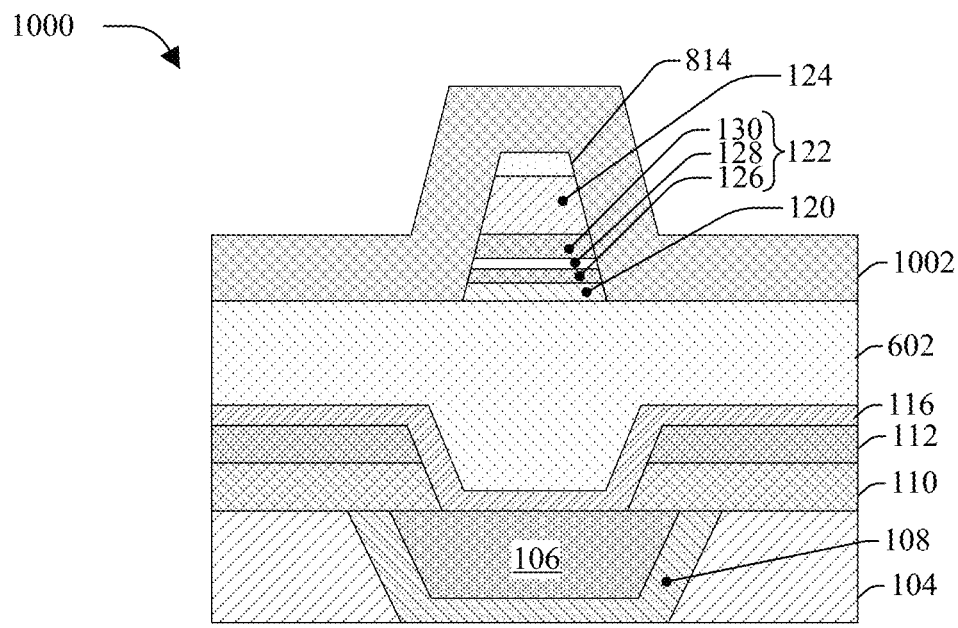

As shown in cross-sectional view 1000 of FIG. 10, a conformal spacer layer 1002 is deposited over the hardmask layer 814, the bottom electrode 120, the memory element 122, and the top electrode 124. The conformal spacer layer 1002 may be comprised of silicon nitride, silicon dioxide, tetraethyl orthosilicate (TEOS), silicon-rich oxide (SRO), some other dielectric material, or a combination of the foregoing. In some embodiments, the conformal spacer layer 1002 may be formed by a vapor deposition technique (e.g., physical vapor deposition, chemical vapor deposition, etc.).

Figure 11:
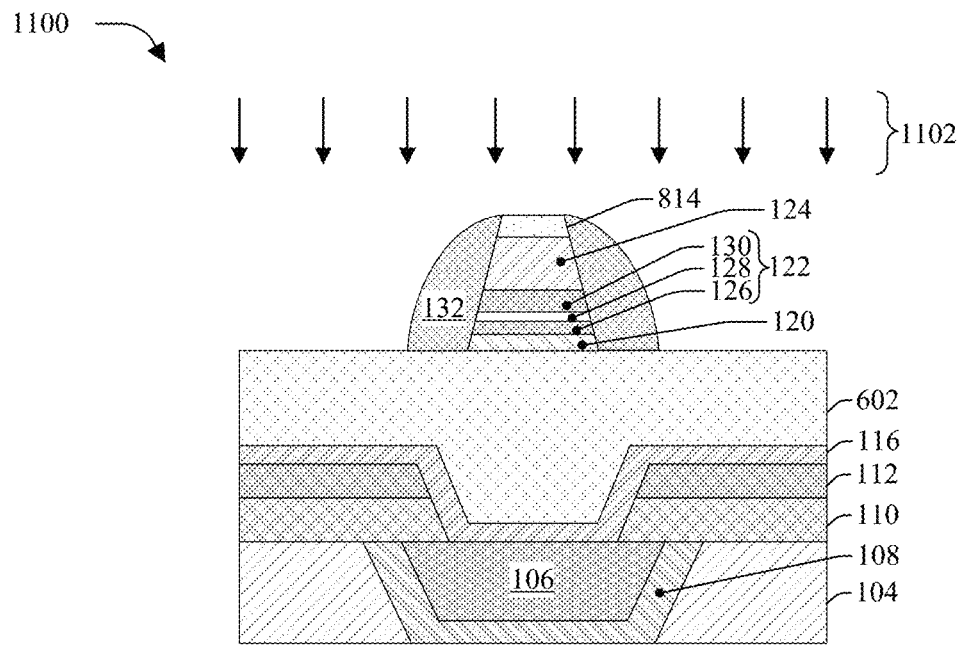

As shown in cross-sectional view 1100 of FIG. 11, an etch 1102 is performed to form a dielectric spacer 132 from the conformal spacer layer 1002. The etching 1102 may be a dry etch, such as a plasma etch, to reach the BEVA layer 602.

Figure 12:
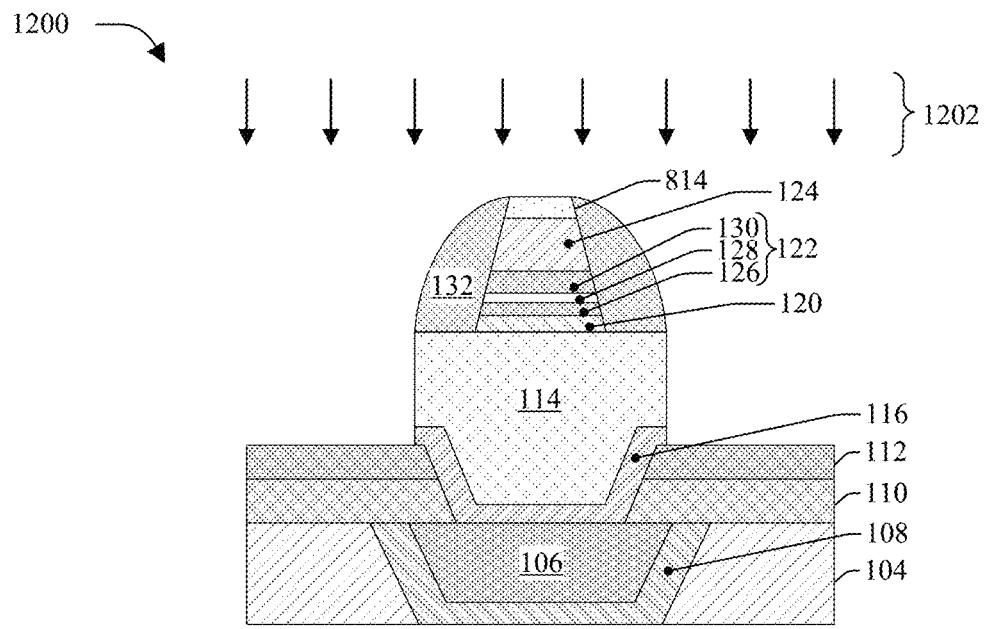

As shown in cross-sectional view 1200 of FIG. 12, an etch 1202 is performed to form a BEVA 114 from the BEVA layer 602, and to further pattern the second diffusion barrier layer 116. The etching 1202 may be a dry etch, such as a plasma etch, to reach the second dielectric protection layer 112. In some embodiments, the outer sidewalls of the BEVA 114 and the second diffusion barrier layer 116 extend downward from the outer sidewalls of the dielectric spacer 132. Further, the outer sidewalls of the BEVA 114 and the diffusion barrier layer 116 may, for example, be collinear.

Figure 13:
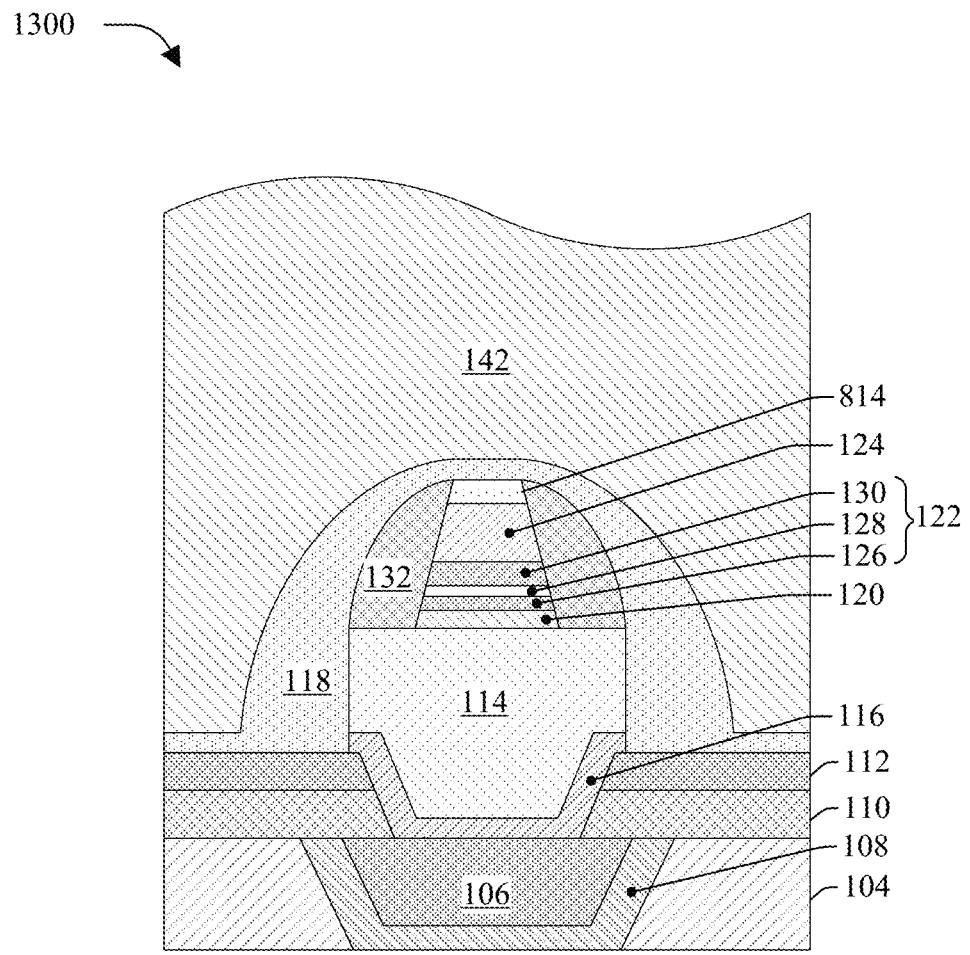

As shown in cross-sectional view 1300 of FIG. 13, a protective layer 118 is deposited over the second dielectric protection layer 112, the dielectric spacer 132, and the hardmask layer 814. The protective layer 118 acts as an etch stop and may be comprised of silicon carbide, silicon nitride, or combinations thereof. Furthermore, an upper ILD layer 142 is deposited over the protective layer 118. The upper ILD layer 142 may be or otherwise comprise, for example, a dielectric material, such as TEOS.

Figure 14:
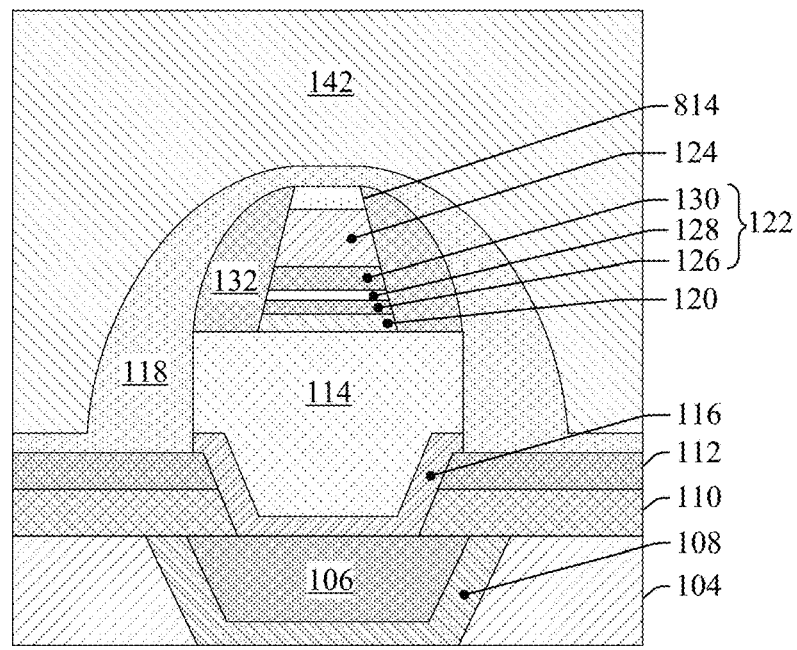

As shown in cross-sectional view 1400 of FIG. 14, a planarization process is performed into the upper ILD layer 142 to flatten an upper surface of the upper ILD layer 142. In some embodiments, the planarization process may be performed by a chemical mechanical planarization (CMP).

Figure 15:
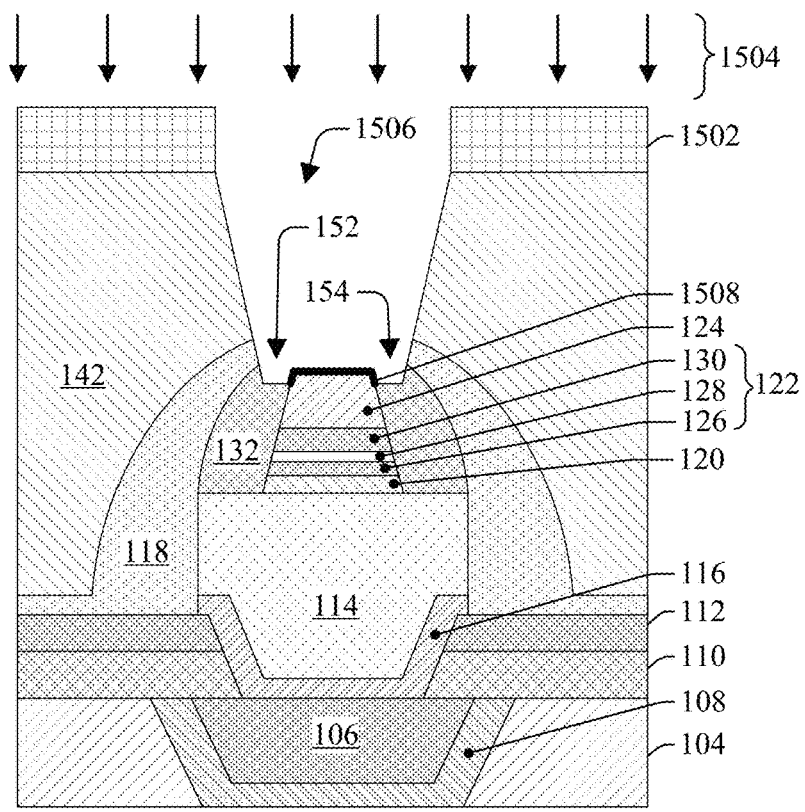

As shown in cross-sectional view 1500 of FIG. 15, a mask layer 1502 is formed over the upper ILD layer 142. In some embodiments, the mask layer 1502 can be a photoresist layer. An etching process 1504 is used to pattern a via opening 1506 in the upper ILD layer 142 that extends through the hardmask layer 814 to the top electrode 124. Because the via opening 1506 exposes the top electrode 124, exposed portions of the top electrode 124 may oxidize, thereby forming an oxide layer 1508 on the top electrode 124. The oxidation increases contact resistance of the top electrode 124, which may negative affect performance of the memory cell. In some embodiments, over etching on opposite sides of the hardmask layer 814 causes a first trench 152 and a second trench 154 to be formed respectively on the opposite sides of the top electrode 124.

Figure 16:
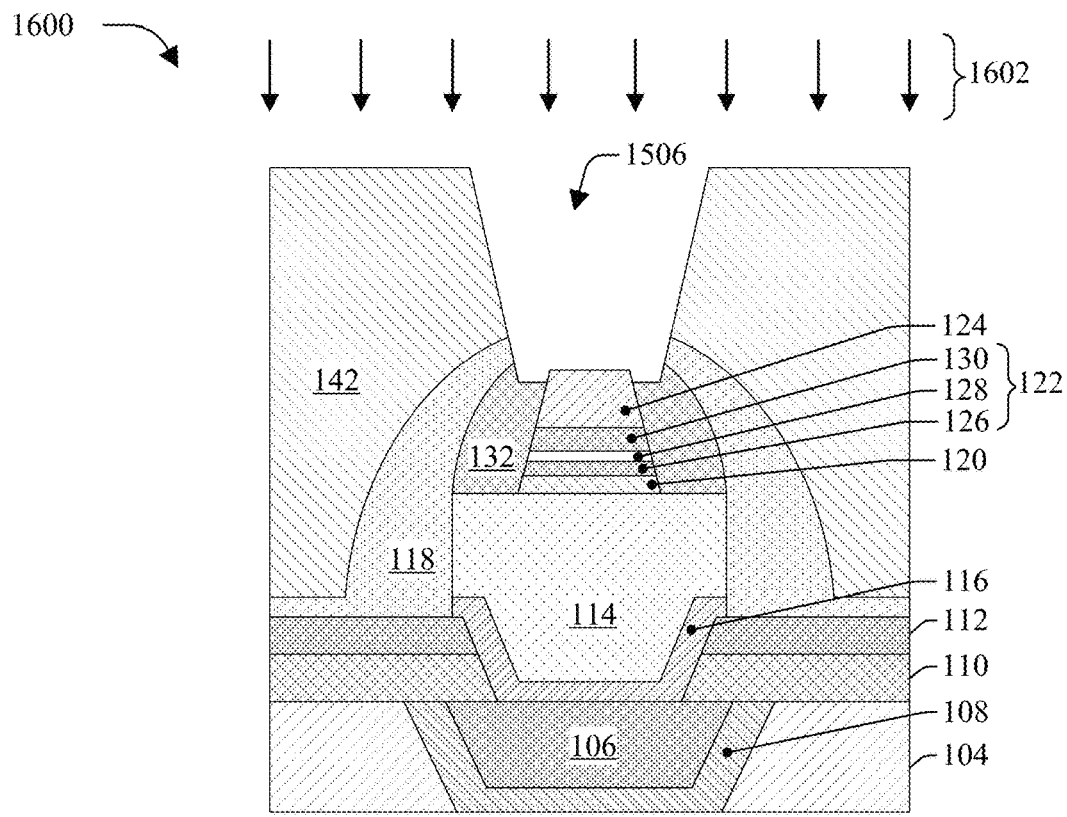

As shown in cross-sectional view 1600 of FIG. 16, the top electrode 124 is cleaned 1602 to remove the oxide layer 1508 (see FIG. 15) on the top electrode 124. In some embodiments, the top electrode 124 is cleaned using sputtering techniques in which the oxide layer 1508 and the uppermost surface of the top electrode 124 are physically eroded by ion bombardment. For example, in a magnetron sputtering operation, a low-pressure gas plasma bombards the oxide layer 1508 and the uppermost surface of the top electrode 124 causing atoms, like the oxygen atoms, at the surface to be knocked away. The gas may be an inert noble gas, such as argon. The top electrode 124 may be cleaned for a predetermined length of time, such as 5-7 seconds. Alternatively, the top electrode 124 may be cleaned to remove the oxide layer 1508 and a predetermine amount of the top electrode 124. For example, the top electrode 124 may have an initial height before the cleaning and a second reduced height that is desired after the cleaning. In some embodiments, the cleaning may leave the uppermost surface of the top electrode 124 uneven, grooved, or pitted.

Figure 17:
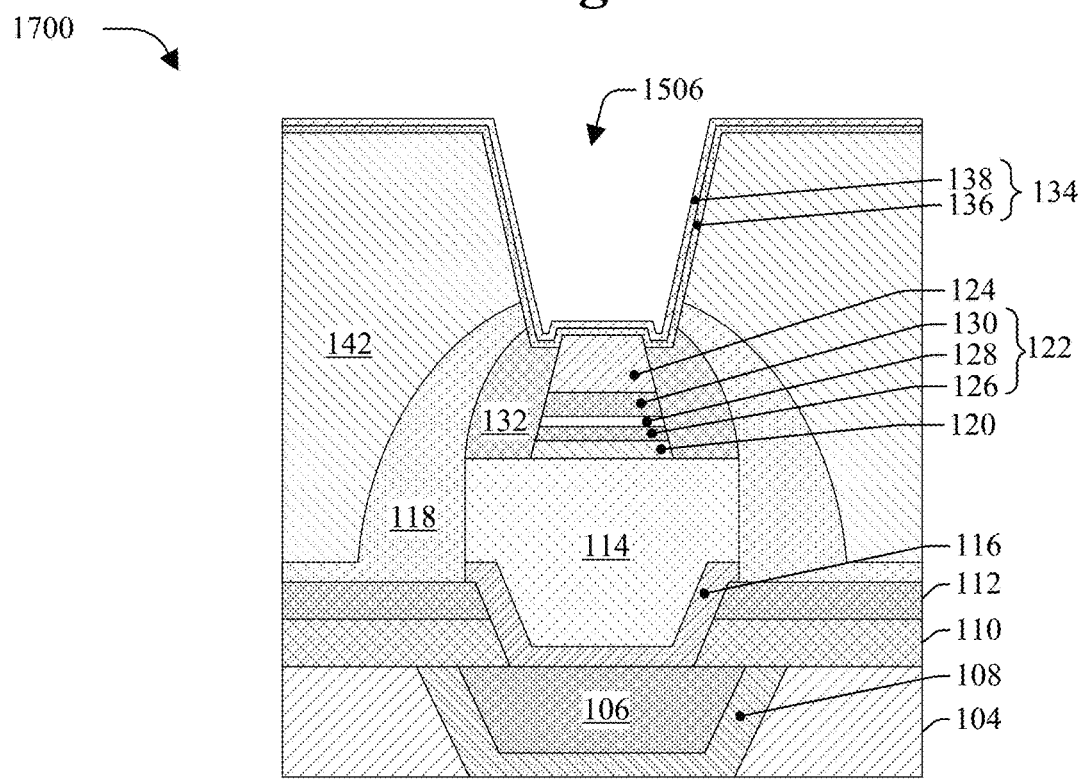

As shown in cross-sectional view 1700 of FIG. 17, a getter layer 136 is deposited over the top electrode 124 in the via opening 1506. In some embodiments, the getter layer 136 is deposited by physical vapor deposition, chemical vapor deposition, or some other deposition process. The getter layer 136 may be less than about 10 nanometers thick. For example, the getter layer 136 may be about 5 nanometers thick. In some embodiments, the getter layer 136 is formed of a getter material that absorbs and/or consumes gases, such as oxygen, to prevent oxidation of the top electrode 124. The getter material may be or otherwise comprise, for example, one or more of titanium, zirconium, hafnium, rutherfordium, palladium, palladium silver, palladium rutherfordium, lanthanum, or a combination of the foregoing.

In some embodiments, the getter material may be or otherwise comprise a group IV element, such as titanium (Ti), zirconium (Zr), hafnium (Hf), or rutherfordium (Rf), because these elements form stable hydrides, which facilitate gettering of hydrogen gas ($H_2$), oxygen gas ($O_2$), nitrogen gas ($N_2$), and water vapor ($H_2O$). Further, in some embodiments, the getter material may be selected for reactivity with errant gases in order to consume any errant gasses that are present. In an alternative embodiment, the getter material may be or otherwise comprise palladium (Pd) or a palladium alloy, such as palladium ruthenium (PdRu) or palladium silver (PdAg). In some embodiments, the getter layer 136 is a first material having a higher reactivity with oxygen (e.g., requires less energy to react with oxygen) than a second material of the top electrode 124. For example, the top electrode 124 may be tantalum, whereas the getter layer 136 may be hafnium, titanium, zirconium, or lanthanum.

In some embodiments, the getter material is a metal rich material. For example, the getter layer 136 may be comprised of a titanium rich material, which has a getter capacity for $H_2$ of 27 Pa-l/mg, a getter capacitor of $O_2$ of 4.4 Pa-l/mg, and a getter capacity for $N_2$ of 0.85 Pa-l/mg. In one embodiment, the getter material may be selected on its affinity to a particular gas. For example, titanium has an increased affinity to $H_2$ as compared other group IV elements. The getter material may also be selected for physical characteristics. For example, the getter material may be selected for mechanical strength, non-crystalline lattice structure, etc.

As further shown in cross-sectional view 1700 of FIG. 17, an oxygen-resistant layer 138 is deposited over the getter layer 136. For example, a lowermost surface of the oxygen-resistant layer 138 may contact an uppermost surface of the getter layer 136. The oxygen-resistant layer 138 may be deposited by, for example, physical vapor deposition, chemical vapor deposition, or some other deposition process. The oxygen-resistant layer 138 may be or otherwise comprise, for example, tantalum nitride (TaN), titanium nitride (TiN), nickel, tungsten, copper, gold, ruthenium, platinum, or a combination of the foregoing. In some embodiments, the titanium nitride has a ratio or nitrogen to titanium (N/Ti) by mass that is about 0.9-1.1 (e.g., 1.02). Further, in some embodiments, the oxygen-resistant layer 138 is titanium nitride (e.g., with ratio of N/Ti of about 1.02), the getter layer 136 is titanium (e.g., pure or elemental titanium), and the top electrode 124 is tantalum (e.g., pure or elemental tantalum). The oxygen-resistant layer 138 may have a thickness, based at least in part, on the type of memory element 122. For example, the thickness of the oxygen-resistant layer 138 may be about 2-20 nanometers. In some embodiments, the thickness of the oxygen-resistant layer 138 is about 10 nanometers. The oxygen-resistant layer 138 prevents any additional oxygen from reaching the getter layer 136 and/or the top electrode 124.

In some embodiments, to reduce the possibility of exposing the getter layer 136 and/or the top electrode 124 to oxygen, the cleaning described with respect to FIG. 16 and the depositions of the getter and oxygen-resistant layers 136, 138 are performed in situ. For example, the top electrode 124 may be cleaned at FIG. 16, and the getter and oxygen-resistant layers 136, 138 may be subsequently deposited at FIG. 17, within the same process chamber and/or without moving the semiconductor structure at FIGS. 16 and 17.

Figure 18:
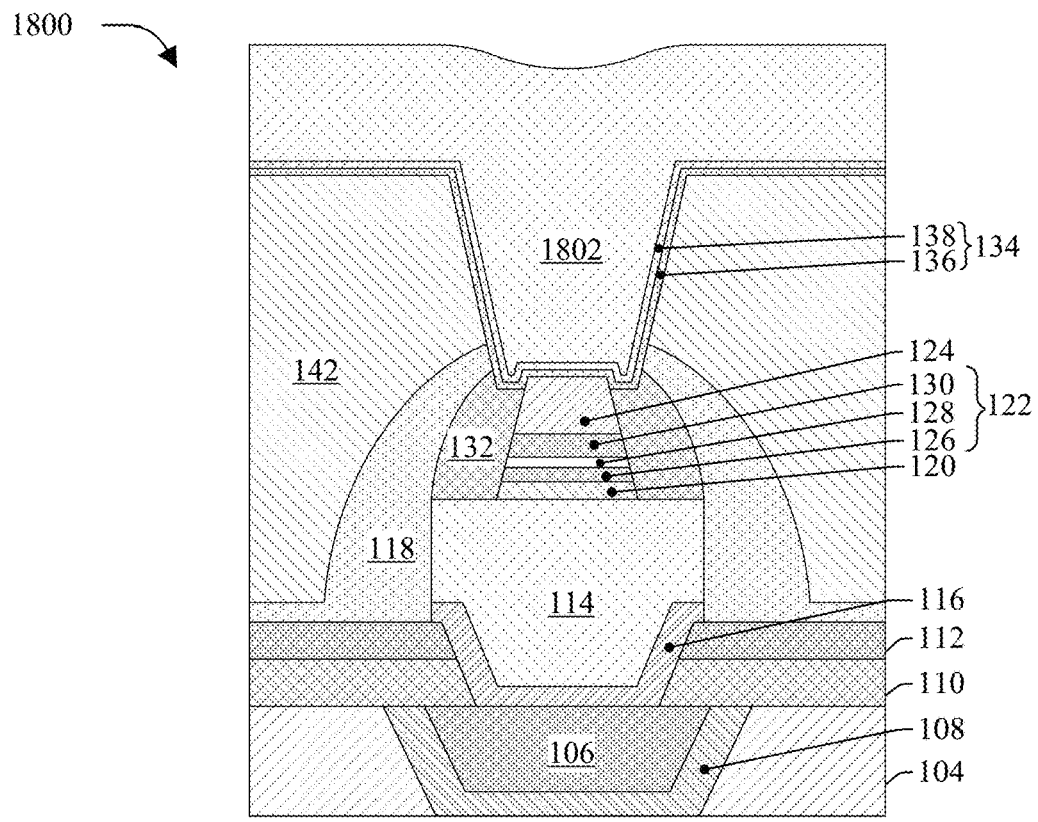

As shown in cross-sectional view 1800 of FIG. 18, the via opening 1506 (see FIG. 17) is overfilled with a conductive material (e.g., copper, aluminum, etc.) to form a top electrode via (TEVA) layer 1802.

Figure 19:
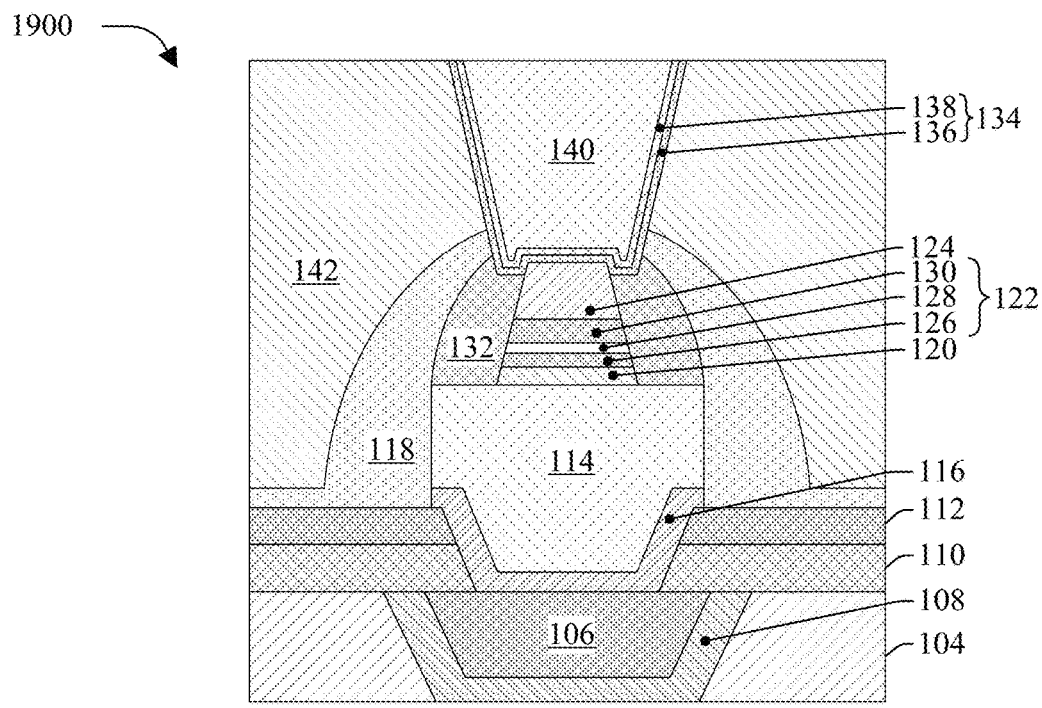

As shown in cross-sectional view 1900 of FIG. 19, a planarization process is performed into the TEVA layer 1802 form a TEVA 140. In some embodiments, the planarization process may be performed by a chemical mechanical planarization (CMP).

Figure 20:
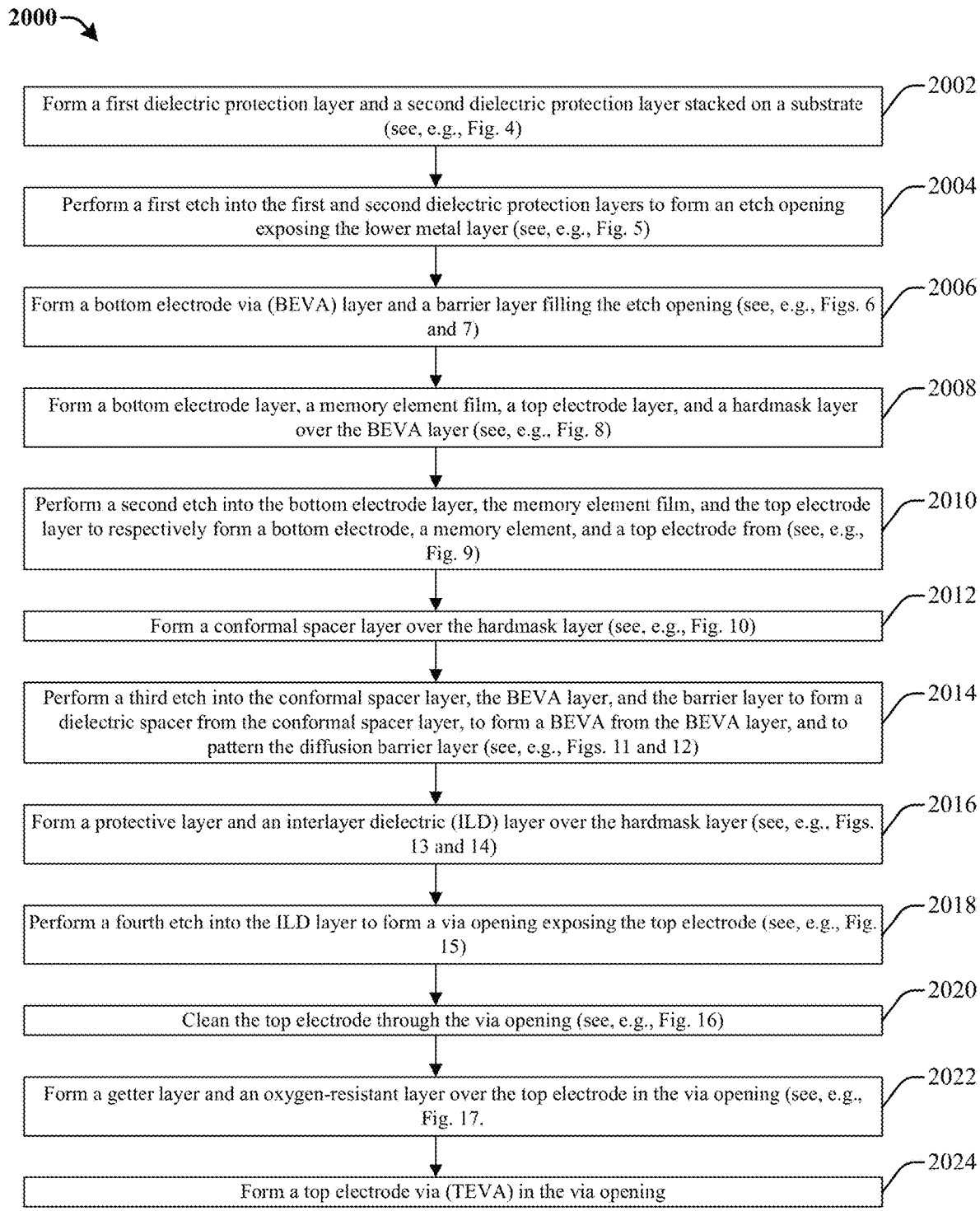
FIG. 20 illustrates a flowchart of some embodiments of the method of FIGS. 4-19.

FIG. 20 illustrates a flowchart 2000 of some embodiments of a method of forming a memory cell with an enhanced cap structure. The method may, for example, correspond to the method of FIGS. 4-19. Further, the memory cell may, for example, correspond to the memory cell of FIGS. 1A and 1B.

At 2002, a first dielectric protection layer and a second dielectric protection layer are formed stacked on a substrate. The substrate includes a lower ILD layer and a lower metal line sunk into a top of the lower ILD layer. See, for example, FIG. 4.

At 2004, a first etch is performed into the first and second dielectric protection layers to form an etch opening exposing the lower metal layer. See, for example, FIG. 5.

At 2006, a barrier layer and a BEVA layer are formed filling the etch opening. The BEVA layer 602 may be planarized. See, for example, FIGS. 6 and 7.

At 2008, a bottom electrode layer, a memory element film, a top electrode layer, and a hardmask layer are formed over the BEVA layer. See, for example, FIG. 8.

At 2010, a second etch is performed into the bottom electrode layer, the memory element film, and the top electrode layer to respectively form a bottom electrode, a memory element, and a top electrode from. See, for example, FIG. 9.

At 2012, a conformal spacer layer 1002 is formed over the hardmask layer 814. See, for example, FIG. 10.

At 2014, a third etch is performed into the conformal spacer layer, the BEVA layer, and the barrier layer to form a dielectric spacer from the conformal spacer layer, to form a BEVA from the BEVA layer, and to pattern the diffusion barrier layer. See, for example, FIGS. 11 and 12.

At 2016, a protective layer and an ILD layer are formed over the hard mask layer. The ILD layer may be planarized. See, for example, FIGS. 13 and 14.

At 2018, a fourth etch is performed into the ILD layer to form a via opening exposing the top electrode. See, e.g., FIG. 15. Exposure of the top electrode may result in oxidation of the top electrode. The oxidation may, for example, negatively affect the memory cell by, among other things, increasing a contact resistance of the top electrode.

At 2020, the top electrode is cleaned through the via opening to, for example, remove oxidation on the top electrode. The top electrode may be cleaned using ion bombardment. See, for example, FIG. 16.

At 2022, a getter layer is formed in the via opening and is in contact with the top electrode. The getter layer is formed with a metal rich getter layer that is 50% metal by weight. The getter layer advantageously removes any oxygen remaining on the top electrode after the cleaning at 2020. Also at 2022, an oxygen-resistant layer is formed over the getter layer. The oxygen-resistant layer is formed from an oxygen resistant material. See, e.g., FIG. FIG. 17. In some embodiments, the cleaning at 2020 and the forming of the getter and oxygen-resistant layers at 2022 are performed in situ within a common process chamber and/or without moving the memory cell under manufacture.

At 2024, a TEVA is formed in the via opening over the cap structure. The TEVA may be planarized. See, for example, FIGS. 18 and 19.

Although the method is described in relation to FIGS. 4-19, it will be appreciated that the method is not limited to the structures disclosed in FIGS. 4-19, but instead may stand alone independent of the structures disclosed in FIGS. 4-19. Similarly, it will be appreciated that the structures disclosed in FIGS. 4-19 are not limited to the method, but instead may stand alone as structures independent of the method.

Further, while the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, in some embodiments, the present application provides a method for forming a top-electrode cap structure on a memory cell. The method includes providing a memory cell comprising a top electrode, a bottom electrode, and a resistive memory element sandwiched between the top and bottom electrodes. An etch is performed into an interlayer dielectric (ILD) layer covering the memory cell to form a via opening exposing the top electrode of the memory cell. A getter layer is then formed to line the via opening, and further, over and abutting the top electrode of the memory cell. An oxygen-resistant layer is formed over and abutting the getter layer.

In other embodiments, the present application provides a memory device that comprises a bottom electrode, a resistive memory element overlying the bottom electrode, and a top electrode overlying the memory element. The memory device further includes a cap structure overlying the top electrode. The cap structure comprises a getter layer and an oxygen-resistant layer overlying the getter layer.

In yet other embodiments, the present disclosure provides a memory device having a substrate including an inter-layer dielectric (ILD) layer, a metal wire recessed into a top of the ILD layer, and a dielectric protection layer overlying the ILD layer and the metal wire. The memory device also includes a bottom electrode via (BEVA) overlying the metal wire. The BEVA extends through the dielectric protection layer from over the dielectric protection layer. The memory device also has a bottom electrode, a memory element, and a top electrode stacked on the BEVA. The memory element is positioned between the bottom electrode and the top electrode. A dielectric spacer overlies the BEVA and opposite sides of the memory element. The dielectric spacer laterally contacts the top electrode, the memory element, and the bottom electrode. A top electrode via (TEVA) overlies the top electrode. A cap structure is positioned between and contacts the top electrode and the TEVA. The cap structure includes a getter layer contacting the top electrode, and an oxygen-resistant layer contacting the getter layer and the TEVA.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a bottom electrode;
    a data storage element overlying the bottom electrode;
    a top electrode overlying the data storage element;
    a top electrode via (TEVA) overlying the top electrode; and
    an oxygen-absorptive layer and an oxygen-resistant layer stacked between the TEVA and the top electrode, wherein the oxygen-absorptive layer and the oxygen-resistant layer cup an underside of the TEVA.

2. The memory device according to claim 1, wherein the oxygen-absorptive layer directly contacts the top electrode and the oxygen-resistant layer, and wherein the oxygen-resistant layer directly contacts the TEVA.

3. The memory device according to claim 1, wherein the oxygen-absorptive layer is at least 50% group IV metal by weight.

4. The memory device according to claim 1, wherein the oxygen-absorptive layer and the oxygen-resistant layer share a metal element.

5. The memory device according to claim 1, wherein the oxygen-absorptive layer laterally and directly contacts a sidewall of the top electrode.

6. The memory device according to claim 1, wherein the top electrode and the data storage element define a common sidewall that is smooth from top to bottom, wherein the memory device further comprises a sidewall spacer on the common sidewall, and wherein oxygen-absorptive layer laterally and directly contacts a sidewall of the sidewall spacer.

7. A memory device, comprising:
    a bottom electrode;
    a memory element overlying the bottom electrode;
    a top electrode overlying the memory element;
    a via overlying the top electrode; and
    a cap layer between the via and the top electrode, wherein the cap layer is configured to absorb an errant material at a lower side of the cap layer, and wherein the cap layer is configured to resist reaction with the errant material at an upper side of the cap layer.

8. The memory device according to claim 7, wherein the cap layer wraps around a bottom of the via from a bottom surface of the via to a sidewall of the via.

9. The memory device according to claim 7, wherein the errant material comprises oxygen.

10. The memory device according to claim 7, wherein the errant material comprises hydrogen and/or nitrogen.

11. The memory device according to claim 7, wherein the cap layer comprises:
    a group IV metal layer at the lower side of the cap layer; and
    a metal nitride layer at the upper side of the cap layer, wherein the group IV metal layer and the metal nitride layer directly contact.

12. The memory device according to claim 11, wherein the group IV metal layer and the metal nitride layer share a group IV metal element.

13. The memory device according to claim 11, wherein the cap layer further comprises a metal oxide layer between and directly contacting the group IV metal layer and the top electrode, and wherein the metal oxide layer and the group IV metal layer share a metal element.

14. The memory device according to claim 7, wherein the cap layer has a pair of U-shaped segments when viewed in cross-section, and wherein the U-shaped segments are respectively on opposite sides of the top electrode.

15. The memory device according to claim 7, wherein the cap layer has a non-metal element at the upper side of the cap layer, and wherein the memory device further comprises:
    a spacer structure on a sidewall of the top electrode and a sidewall of the memory element, wherein the spacer structure comprises the non-metal element.

16. A memory device, comprising:
    a bottom electrode;
    a memory element overlying the bottom electrode;
    a tantalum top electrode overlying the memory element;
    a via overlying the tantalum top electrode; and
    a titanium layer and a titanium nitride layer stacked between the tantalum top electrode and the via, where the titanium layer is substantially devoid of nitrogen, and wherein the titanium layer and the titanium nitride layer extend along a sidewall of the via.

17. The memory device according to claim 16, wherein the titanium layer depends upon less energy to react with oxygen than the tantalum top electrode, and wherein the titanium nitride layer depends upon more energy to react with oxygen than the titanium layer and the tantalum top electrode.

18. The memory device according to claim 16, wherein the titanium layer directly contacts the tantalum top electrode and the titanium nitride layer.

19. The memory device according to claim 18, wherein the titanium nitride layer directly contacts the sidewall of the via and a sidewall of the titanium nitride layer.

20. The memory device according to claim 16, wherein the via has a downward protrusion along a sidewall of the tantalum top electrode, and wherein the titanium layer and the titanium nitride layer wrap around the downward protrusion to separate the downward protrusion from the sidewall of the tantalum top electrode.

* * * * *